US012708055B2

(12) United States Patent
Takakura et al.

(10) Patent No.: US 12,708,055 B2
(45) Date of Patent: Aug. 11, 2026

(54) SUBSTRATE STRUCTURE, MODULE, METHOD FOR MANUFACTURING THE SUBSTRATE STRUCTURE, AND METHOD FOR MANUFACTURING THE MODULE

(71) Applicant: Murata Manufacturing Co., Ltd., Kyoto-fu (JP)

(72) Inventors: Tsuyoshi Takakura, Nagaokakyo (JP); Ryoichi Kita, Nagaokakyo (JP); Hideo Nakagoshi, Nagaokakyo (JP); Hiroki Yoshimori, Nagaokakyo (JP); Tadashi Nomura, Nagaokakyo (JP); Yoshihito Otsubo, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 513 days.

(21) Appl. No.: 18/188,538

(22) Filed: Mar. 23, 2023

(65) Prior Publication Data

US 2023/0230907 A1 Jul. 20, 2023

Related U.S. Application Data

(63) Continuation of application No. PCT/JP2021/037183, filed on Oct. 7, 2021.

(30) Foreign Application Priority Data

Oct. 8, 2020 (JP) ................................ 2020-170646
Apr. 27, 2021 (JP) ................................ 2021-075251

(51) Int. Cl.
*H10W 90/00* (2026.01)
*H10W 70/60* (2026.01)
(Continued)

(52) U.S. Cl.
CPC ........ *H10W 90/701* (2026.01); *H10W 70/611* (2026.01); *H10W 70/685* (2026.01);
(Continued)

(58) Field of Classification Search
CPC ............... H01L 23/49811; H01L 21/56; H01L 23/3128; H01L 23/3157; H01L 23/5383;
(Continued)

(56) References Cited

U.S. PATENT DOCUMENTS 5,559,054 A * 9/1996 Adamjee ................. H01L 24/13
257/E23.021
6,458,622 B1 10/2002 Keser et al.
(Continued)

FOREIGN PATENT DOCUMENTS

EP 1011141 A2 6/2000
JP 2000-183094 A 6/2000
(Continued)

OTHER PUBLICATIONS

International Search Report for PCT/JP2021/037183 dated Dec. 21, 2021. .

*Primary Examiner* — Thanh Y. Tran
(74) *Attorney, Agent, or Firm* — McDonald Hopkins LLC

(57) ABSTRACT

A substrate structure comprises a substrate having a first surface, a first electrode disposed on the first surface, a bump connected to the first electrode, and a protective member that covers the first surface and covers a portion of the bump. The protective member has an opening. The bump includes a portion exposed through the opening. The bump includes a first portion that is connected to the first electrode, and a second portion that is located farther from the first electrode than the first portion and is connected to the first portion. The bump has a constriction at a boundary between the first portion and the second portion. When viewed in a direction
(Continued)

perpendicular to the first surface, a maximum diameter of the second portion is smaller than a maximum diameter of the first portion.

20 Claims, 13 Drawing Sheets

(51) Int. Cl.
*H10W 70/685* (2026.01)
*H10W 74/01* (2026.01)
*H10W 74/10* (2026.01)

(52) U.S. Cl.
CPC .......... *H10W 74/01* (2026.01); *H10W 74/117* (2026.01); *H10W 74/131* (2026.01); *H10W 90/00* (2026.01)

(58) Field of Classification Search
CPC ..... H01L 25/18; H01L 25/50; H01L 23/3121; H01L 25/0652; H01L 25/16; H01L 23/295; H01L 23/49866; H01L 24/05; H01L 24/11; H01L 24/13; H01L 24/16; H10W 90/701; H10W 70/611; H10W 70/685; H10W 74/01; H10W 74/117; H10W 90/00; H10W 70/687; H10W 70/66; H10W 72/012; H10W 72/072; H10W 72/20; H10W 72/90; H10W 74/00; H10W 74/142; H10W 90/724; H10W 74/114; H10W 74/473; H10W 72/071
See application file for complete search history.

(56) References Cited

U.S. PATENT DOCUMENTS

| | | | | |
|---|---|---|---|---|
| 7,569,935 | B1 * | 8/2009 | Fan | H01L 24/16 257/737 |
| 9,190,367 | B1 * | 11/2015 | Liao | H01L 23/49827 |
| 10,163,867 | B2 | 12/2018 | Kim et al. | |
| 2004/0191955 | A1 * | 9/2004 | Joshi | H01L 23/3171 257/E23.021 |
| 2008/0202803 | A1 * | 8/2008 | Nagase | H05K 3/4007 174/262 |
| 2010/0171207 | A1 * | 7/2010 | Shen | H01L 24/97 438/107 |
| 2019/0051582 | A1 | 2/2019 | Kim | |
| 2019/0237421 | A1 | 8/2019 | Tsuchiya | |
| 2019/0385961 | A1 * | 12/2019 | Lu | H01L 24/13 |
| 2020/0118913 | A1 | 4/2020 | Matsukawa et al. | |
| 2023/0067475 | A1 * | 3/2023 | Cho | H01L 23/66 |

FOREIGN PATENT DOCUMENTS

| | | | |
|---|---|---|---|
| JP | 2000-306939 | A | 11/2000 |
| JP | 4211149 | B2 | 1/2009 |
| JP | 2009-088431 | A | 4/2009 |
| JP | 5415657 | B2 | 2/2014 |
| JP | 2019-005789 | A | 1/2019 |
| JP | 2019-134007 | A | 8/2019 |
| WO | 2018/235715 | A1 | 12/2018 |

* cited by examiner

SUBSTRATE STRUCTURE, MODULE, METHOD FOR MANUFACTURING THE SUBSTRATE STRUCTURE, AND METHOD FOR MANUFACTURING THE MODULE

CROSS REFERENCE TO RELATED APPLICATION

This is a continuation of International Application No. PCT/JP2021/037183 filed on Oct. 7, 2021 which claims priority from Japanese Patent Application No. 2020-170646 filed on Oct. 8, 2020 and Japanese Patent Application No. 2021-075251 filed on Apr. 27, 2021. The contents of these applications are incorporated herein by reference in their entireties.

BACKGROUND OF THE DISCLOSURE

Field of the Disclosure

The present disclosure relates to a substrate structure, a module, a method for manufacturing the substrate structure, and a method for manufacturing the module.

Description of the Related Art

U.S. Pat. No. 10,163,867B2 (PTL 1) discloses a configuration in which two solder bumps are disposed, one on the other, as a connection member in a through hole formed through a resin seal on a lower surface of a substrate. When an electronic device mounted on the same surface of the substrate and covered with a resin seal is large in height, the through hole in the resin seal is increased in length, and as a result, a single solder bump alone is insufficient in height, and accordingly, as shown in PTL 1, providing a solder bump in two stages may be considered. When solder bumps are stacked in two stages, a constricted portion is made at their joint.

PTL 1: U.S. Pat. No. 10,163,867B2

BRIEF SUMMARY OF THE DISCLOSURE

According to PTL 1, however, of the solder bumps stacked in two stages, one farther from the substrate is larger in diameter than one closer to the substrate. When this semiconductor package is mounted on a mother substrate, stress tends to concentrate at the constricted portion, and the constricted portion is thus crackable. As the solder bump farther from the substrate increases in diameter, the constricted portion experiences larger stress and is thus crackable.

Accordingly, a possible benefit of the present disclosure is to provide a substrate structure, a module, a method for manufacturing the substrate structure, and a method for manufacturing the module, that can suppress cracking during mounting and achieve more reliable connection.

In order to achieve the above possible benefit, a substrate structure according to the present disclosure comprises: a substrate having a first surface; a first electrode disposed on the first surface; a bump connected to the first electrode; and a protective member that covers the first surface and covers a portion of the bump. The protective member has an opening. The bump includes a portion exposed through the opening. The bump includes a first portion that is connected to the first electrode, and a second portion that is farther from the first electrode than the first portion and is connected to the first portion. The bump has a constriction at a boundary between the first portion and the second portion. When viewed in a direction perpendicular to the first surface, a maximum diameter of the second portion is smaller than a maximum diameter of the first portion.

The present disclosure can suppress cracking during mounting and achieve more reliable connection.

DETAILED DESCRIPTION OF THE DISCLOSURE

The figures indicate a dimensional ratio, which does not necessarily provide a representation which is faithful to reality, and may be exaggerated for the sake of illustration. In the following description, when referring to a concept of being upper or lower, it does not necessarily mean being absolutely upper or lower and may instead mean being relatively upper or lower in a position shown in a figure.

First Embodiment

Figure 1:
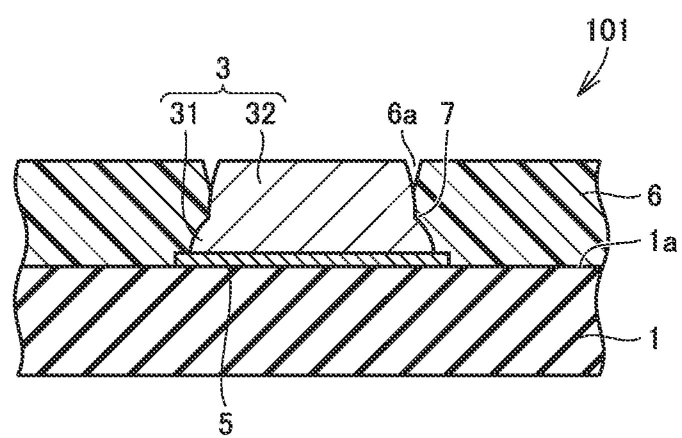
FIG. 1 is a partial cross section of a substrate structure according to a first embodiment of the present disclosure.

A substrate structure according to a first embodiment of the present disclosure will be described with reference to FIGS. 1 and 2. FIG. 1 is a partial cross section of a substrate structure 101 according to the present embodiment.

Substrate structure 101 includes a substrate 1 having a first surface 1*a*, a first electrode 5 disposed on first surface 1*a*, a bump 3 connected to first electrode 5, and a protective member 6 that covers first surface 1*a* and covers a portion of a bump 3. FIG. 2 is an enlarged view of bump 3 and a vicinity thereof in FIG. 1. Protective member 6 has an opening 6*a*. Bump 3 includes a portion exposed through opening 6*a*. Bump 3 includes a first portion 31 that is connected to first electrode 5, and a second portion 32 that is located farther from first electrode 5 than first portion 31 and is connected to first portion 31. Bump 3 has a constriction 7 at a boundary between first portion 31 and second portion 32. When viewed in a direction perpendicular to first surface 1*a*, a maximum diameter B of second portion 32 is smaller than a maximum diameter A of first portion 31.

Bump 3 may be formed for example of solder. Protective member 6 may be formed for example of resin. First electrode 5 may be formed for example of metal. First electrode 5 may be formed for example of copper. A coating film may be formed on a surface of first electrode 5 to facilitate bonding with bump 3. For example, when bump 3 is formed of solder, an Au/Ni plating film may be formed on the surface of first electrode 5.

In the present embodiment, maximum diameter B of second portion 32 is smaller than maximum diameter A of first portion 31, and a stress acting in second portion 32 of bump 3 can be dispersed in first portion 31. As a result, cracking during mounting can be suppressed and more reliable connection can be achieved.

While in this example, first portion 31 has maximum diameter A at its lower end, first portion 31 may have a shape having a maximum diameter at a portion thereof other than the lower end. While in this example, second portion 32 has maximum diameter B at its lower end, second portion 32 may have a shape having a maximum diameter at a portion thereof other than the lower end.

As shown in the present embodiment, it is preferable that a gap exist between second portion 32 and an internal surface of opening 6*a*. By employing this configuration, second portion 32 can be deformed in response to an external force and as a result, a stress acting after substrate structure 101 is mounted can be alleviated, and more reliable connection can be achieved. As shown in the present embodiment, it is preferable that the first portion is entirely covered with the protective member.

As shown in the present embodiment, in the direction perpendicular to first surface 1*a*, it is preferable that a height H1 of bump 3 with reference to first surface 1*a* be equal to a height H2 of protective member 6 with reference to first surface 1*a*. By employing this configuration, the substrate structure can be reduced in height.

Figure 3:
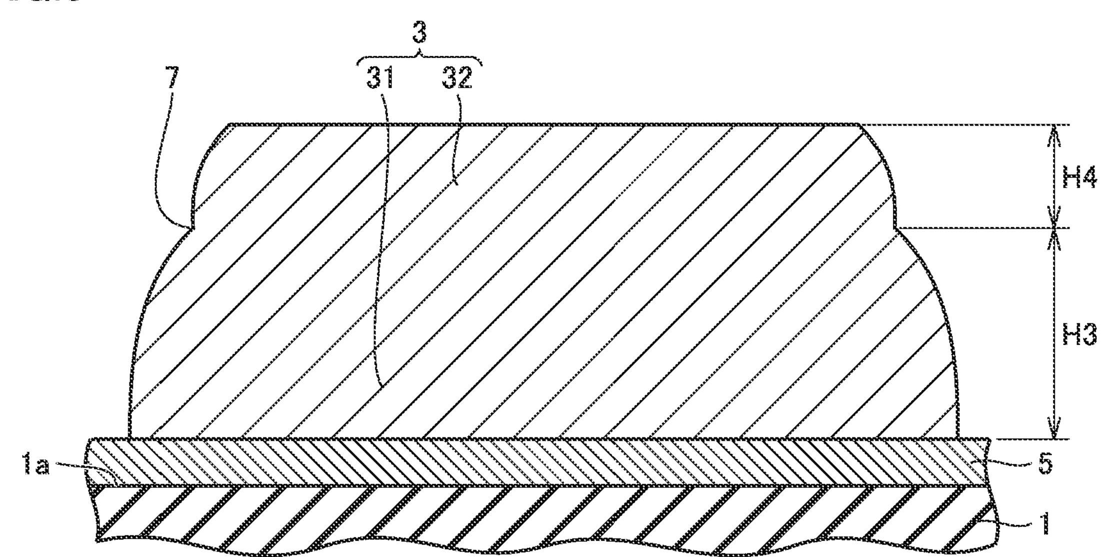
FIG. 3 illustrates a relationship in magnitude in dimension in height of the substrate structure according to the first embodiment of the present disclosure.

As shown in FIG. 3, in the direction perpendicular to first surface 1*a*, it is preferable that a height H4 of second portion 32 with reference to constriction 7 be smaller than a height H3 of first portion 31 with reference to a surface of first electrode 5 facing away from substrate 1. In FIG. 3, for convenience of illustration, only substrate 1, first electrode 5, and bump 3 are shown. This configuration can stabilize bump 3 in shape and suppress cracking.

Second Embodiment

Figure 4:
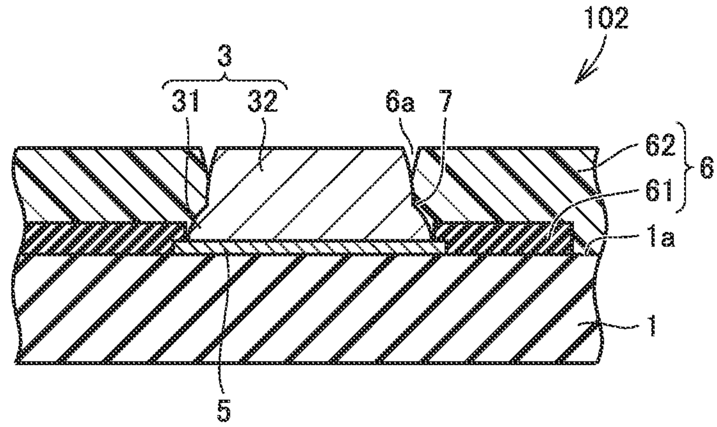
FIG. 4 is a partial cross section of a substrate structure according to a second embodiment of the present disclosure.

Referring to FIG. 4, a substrate structure according to a second embodiment of the present disclosure will be described. FIG. 4 is a partial cross section of a substrate structure 102 according to the present embodiment.

Substrate structure 102 and substrate structure 101 described in the first embodiment are common in terms of a basic structure. In substrate structure 102, protective member 6 includes a protective layer 61 and a resin seal 62. Protective layer 61 covers a connection portion between first electrode 5 and first portion 31. Resin seal 62 covers first portion 31 and protective layer 61. Resin seal 62 is formed of a material having a composition different from that of protective layer 61. Resin seal 62 may also cover a portion of second portion 32.

In the present embodiment, a portion of first electrode 5 is covered with protective layer 61, and first electrode 5 can be prevented from peeling off. Protective layer 61 can cover a region on a surface of first electrode 5 other than a region necessary for electrical connection, and this can prevent a material for first portion 31 from flowing to another, undesired region when first portion 31 of bump 3 is placed on first electrode 5. When there are a plurality of first electrodes 5, clearly dividing exposed portions of the plurality of first electrodes 5 by protective layer 61 can prevent a short circuit caused between different first electrodes 5.

Third Embodiment

Figure 5:
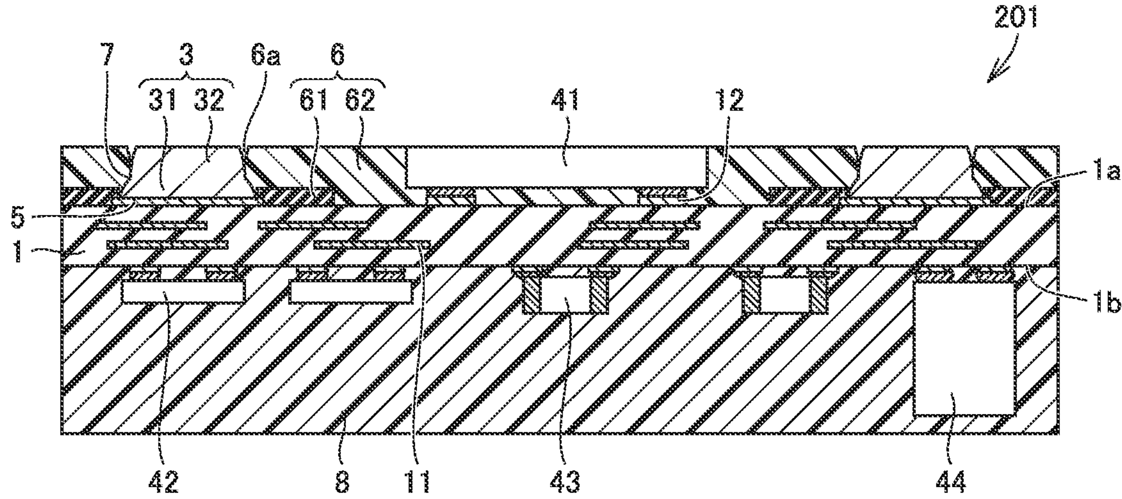
FIG. 5 is a cross section of a module according to a third embodiment of the present disclosure.

A module according to a third embodiment of the present disclosure will be described with reference to FIG. 5. A cross section of a module 201 is shown in FIG. 5.

Module 201 includes a substrate structure having any of the configurations described above, and a first component 41 mounted on first surface 1*a*. At least a portion of first component 41 is covered with protective member 6. A conductor pattern 11 is disposed inside substrate 1. In FIG.

5, substrate 1, first electrode 5, bump 3, protective member 6, and the like configure substrate structure 102 described in the second embodiment. Substrate 1 has a second surface 1*b* as a surface opposite to first surface 1*a*. Components 42, 43 and 44 are mounted on second surface 1*b*. For example, component 42 corresponds to a second component. Second surface 1*b* and components 42, 43 and 44 are covered with a resin seal 8 serving as a second resin seal. A portion of any of components 42, 43 and 44 may be exposed through resin seal 8.

In the present embodiment, for such a reason as described in the above embodiments, cracking caused when mounting on a mother substrate as a module can be suppressed and more reliable connection can be achieved.

While in the present embodiment, as shown in FIG. 5, an example in which a single first components 41 is provided is shown, first component 41 is not limited to a single first component. Module 201 may comprise a plurality of first components 41.

As indicated in the present embodiment, in the direction perpendicular to first surface 1*a*, it is preferable that a height of first component 41 with reference to first surface 1*a*, a height of bump 3 with reference to first surface 1*a*, and a height of protective member 6 with reference to first surface 1*a* be equal to one another. By employing this configuration, the module can be reduced in height to that of first component 41. As will be described in detail later, first component 41 may be ground together with bump 3 and protective member 6 and thus leveled in height.

Fourth Embodiment

A method for manufacturing a substrate structure according to a fourth embodiment of the present disclosure will be described with reference to FIGS. 6 to 10.

The method for manufacturing a substrate structure according to the present embodiment is a "method for manufacturing a substrate structure" for obtaining any of the substrate structures described above. The method for manufacturing the substrate structure comprises the steps of: preparing a product in which the substrate and the first electrode are combined and the first portion is connected to the first electrode; forming a protective member to cover the first portion; grinding an upper surface of the protective member; forming an opening in the protective member by laser processing to expose the first portion through the opening; and connecting a second portion to the first portion. Each step will now be described in detail below.

Figure 6:
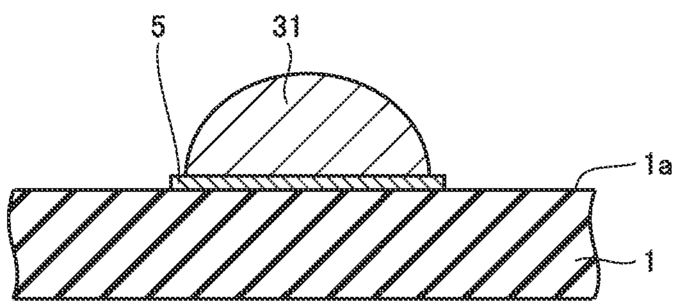
FIG. 6 illustrates a first step of a method for manufacturing a substrate structure according to a fourth embodiment of the present disclosure.

First, as shown in FIG. 6, a product in which substrate 1 and first electrode 5 are combined and first portion 31 is connected to first electrode 5, is prepared. While herein substrate 1 is shown as a simple plate-shaped member, substrate 1 may have a surface with another component such as an electrode disposed thereon. Substrate 1 may have a conductor pattern, a conductor via, and the like therein.

Figure 7:
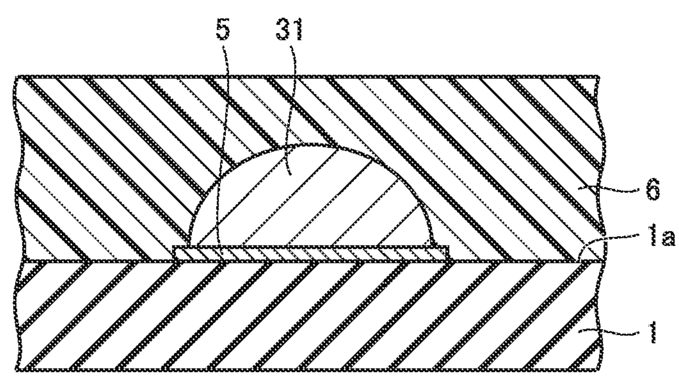
FIG. 7 illustrates a second step of the method for manufacturing the substrate structure according to the fourth embodiment of the present disclosure.

As shown in FIG. 7, protective member 6 is formed so as to cover first portion 31. Protective member 6 may be made of resin. "Resin" as referred to herein may for example be epoxy resin. "Resin" as referred to herein may for example contain a filler made of an inorganic oxide such as silica or alumina. Protective member 6 may be formed by molding.

Figure 8:
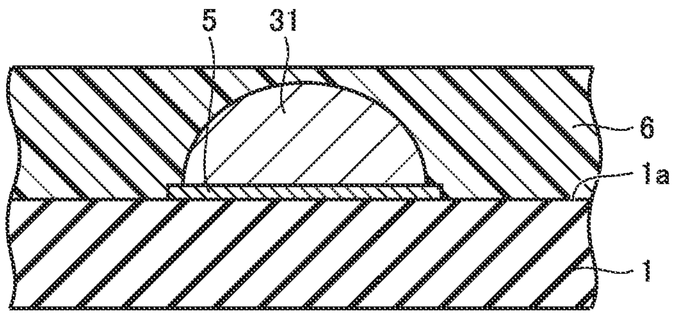
FIG. 8 illustrates a third step of the method for manufacturing the substrate structure according to the fourth embodiment of the present disclosure.

As shown in FIG. 8, an upper surface of protective member 6 is ground. While in FIG. 8, first portion 31 is covered with protective member 6 even after the grinding, this is only an example. The grinding may be performed until first portion 31 is exposed.

Figure 9:
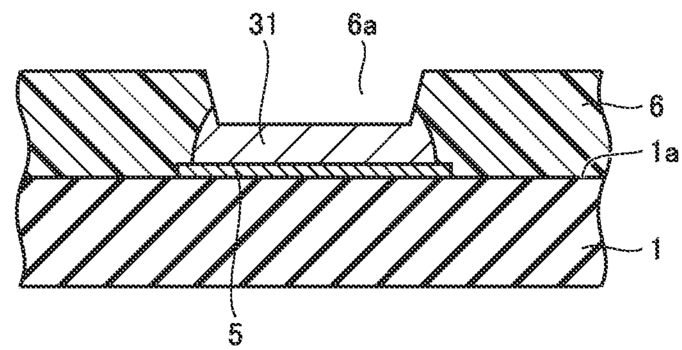
FIG. 9 illustrates a fourth step of the method for manufacturing the substrate structure according to the fourth embodiment of the present disclosure.

As shown in FIG. 9, opening 6*a* is formed in protective member 6 by laser processing to expose first portion 31 through opening 6*a*.

Figure 10:
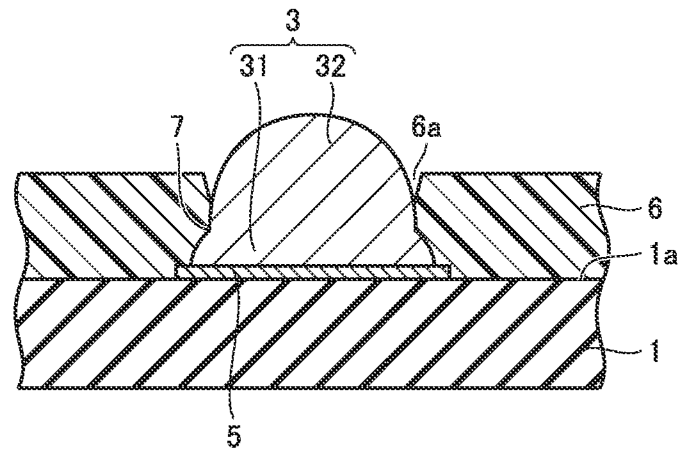
FIG. 10 illustrates a fifth step of the method for manufacturing the substrate structure according to the fourth embodiment of the present disclosure.

As shown in FIG. 10, second portion 32 is connected to first portion 31. Second portion 32 may be identical in material to first portion 31. By placing and heating second portion 32 on first portion 31, first portion 31 and second portion 32 are melted and integrated together. In the state shown in FIG. 10, a portion of bump 3 protrudes from an upper surface of protective member 6. The state shown in FIG. 10 may be a finished product as a substrate structure.

If necessary, an upper surface may be ground. By grinding the upper surface in the state shown in FIG. 10, the structure shown in FIG. 1 can be obtained. Thus, substrate structure 101 can be obtained.

In the present embodiment, a substrate structure that can suppress cracking during mounting and achieve more reliable connection can be obtained.

As shown in the present embodiment, the method may further comprise a step of grinding an upper surface of protective member 6 and second portion 32 together to obtain a structure in which the upper surface of protective member 6 and that of second portion 32 are flush. By employing this configuration, the substrate structure can be reduced in height.

Fifth Embodiment

A method for manufacturing a module according to a fifth embodiment of the present disclosure will be described with reference to FIGS. 11 to 16.

The method for manufacturing the module according to the present embodiment is a "method for manufacturing a module" for obtaining any of the modules described above. The method for manufacturing the module comprises the steps of: preparing a product in which the substrate and the first electrode are combined and the first portion is connected to the first electrode; mounting the first component on the first surface; forming a protective member to cover the first portion and the first component; grinding an upper surface of the protective member to expose the first component; forming an opening in the protective member by laser processing to expose the first portion through the opening; and connecting a second portion to the first portion. Each step will now be described in detail below.

Figure 11:
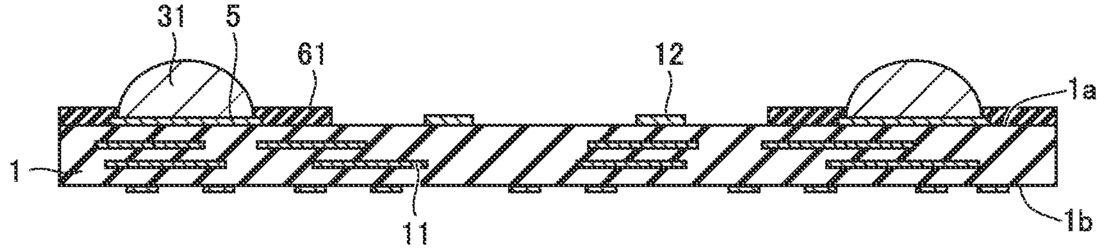
FIG. 11 illustrates a first step of a method for manufacturing a module according to a fifth embodiment of the present disclosure.

First, as shown in FIG. 11, a product in which substrate 1 and first electrode 5 are combined and first portion 31 is connected to first electrode 5, is prepared. A second electrode 12 is provided on first surface 1*a* of substrate 1 in addition to first electrode 5. As shown here, protective film 61 may be formed so as to cover a portion of first electrode 5. First electrode 5 has a region exposed without being covered with protective film 61, and first portion 31 is placed on first electrode 5 in the exposed region. First portion 31 is electrically connected to first electrode 5. Conductor pattern 11 is disposed inside substrate 1. Second surface 1*b* of substrate 1 also has a necessary electrode disposed thereon.

Figure 12:
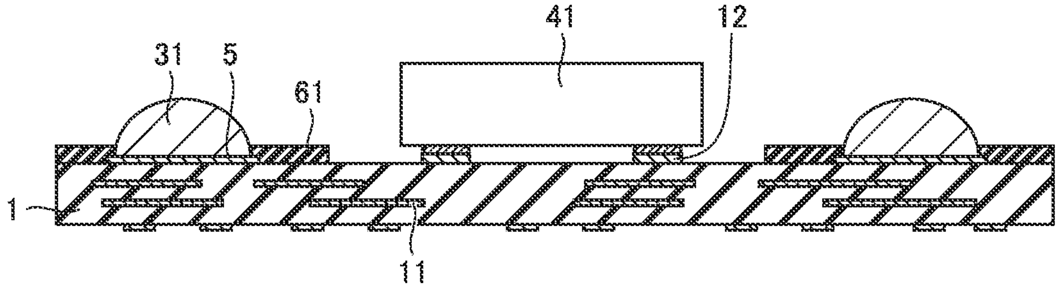
FIG. 12 illustrates a second step of the method for manufacturing the module according to the fifth embodiment of the present disclosure.

As shown in FIG. 12, first component 41 is mounted on first surface 1*a*. First component 41 is electrically connected via second electrode 12 provided on first surface 1*a*.

Figure 13:
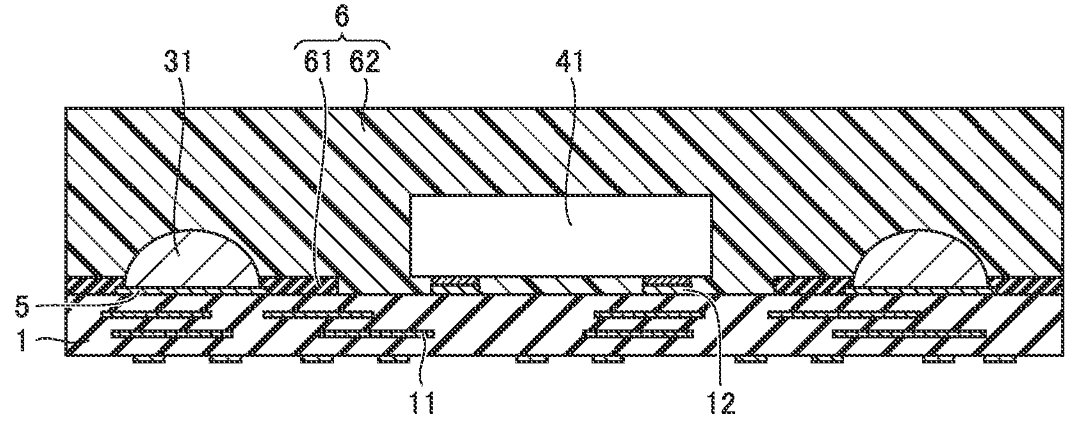
FIG. 13 illustrates a third step of the method for manufacturing the module according to the fifth embodiment of the present disclosure.

As shown in FIG. 13, protective member 6 is formed so as to cover first portion 31 and first component 41. Protective member 6 may include protective film 61 that has already been disposed and a resin seal 62 that is formed later. While an example in which protective film 61 is present is indicated herein, protective film 61 may be dispensed with and protective member 6 may entirely be a resin seal.

Figure 14:
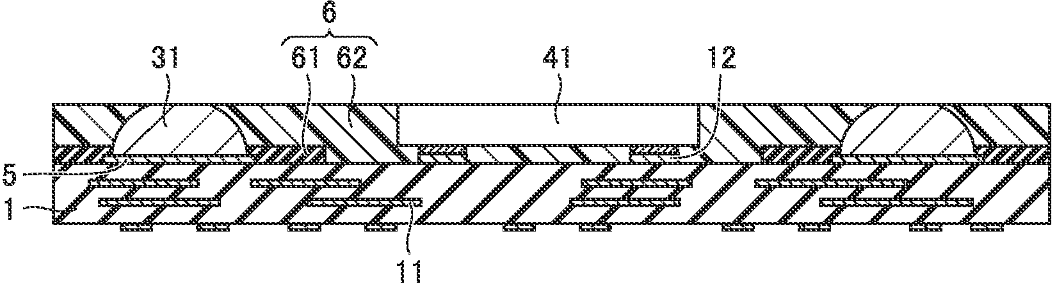
FIG. 14 illustrates a fourth step of the method for manufacturing the module according to the fifth embodiment of the present disclosure.

As shown in FIG. 14, an upper surface of protective member 6 is ground to expose first component 41. When first component 41 is also ground, it is preferable that first component 41 be a component having a configuration in which a circuit portion including a circuit element component is provided on a side closer to substrate 1 and no circuit portion is provided on a side farther from substrate 1. Examples of such a component include semiconductor components, surface acoustic wave filters, bulk acoustic wave filters, integrated passive devices, and the like. First component 41 illustrated in the present embodiment includes a circuit portion on a side closer to substrate 1 and does not include an important circuit or the like on a side farther from substrate 1, and there is no problem even if a portion of first component 41 on the side farther from substrate 1 is ground away. As can be seen from comparison between FIGS. 13 and 14, first component 41 may be reduced in thickness by this grinding step. While in FIG. 14, as a result of the grinding step, first portion 31 is also exposed through protective member 6, this is only an example. The grinding step may be finished in a state with first component 41 exposed and first portion 31 unexposed.

Figure 15:
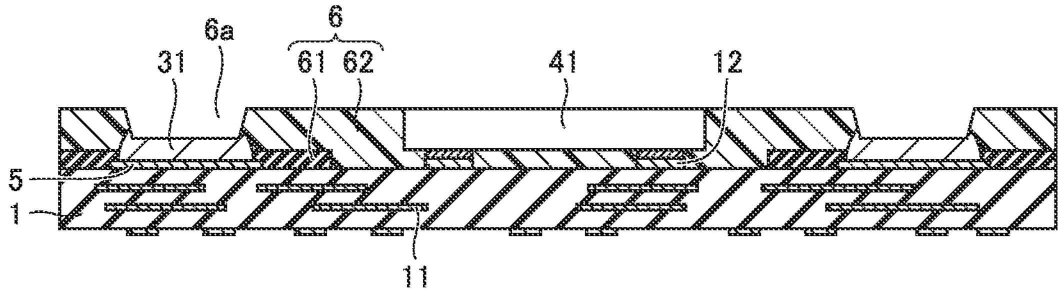
FIG. 15 illustrates a fifth step of the method for manufacturing the module according to the fifth embodiment of the present disclosure.

As shown in FIG. 15, opening 6*a* is formed in protective member 6 by laser processing to expose first portion 31 through opening 6*a*. This state ensures that first portion 31 is exposed.

Figure 16:
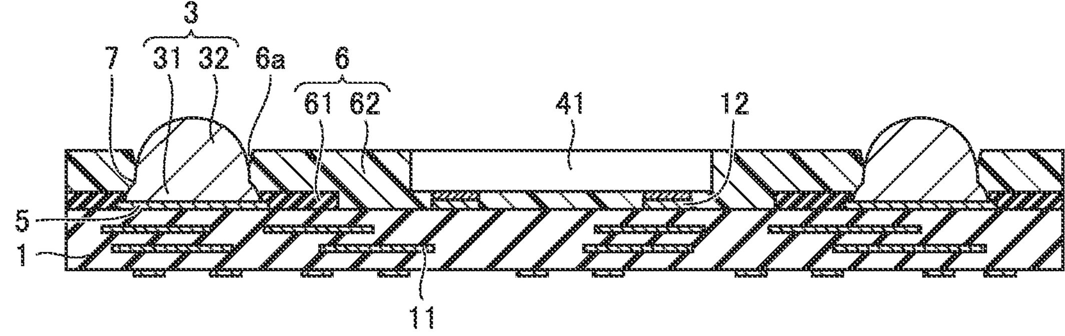
FIG. 16 illustrates a sixth step of the method for manufacturing the module according to the fifth embodiment of the present disclosure.

As shown in FIG. 16, second portion 32 is connected to first portion 31. The module may be completed by the above steps.

In the present embodiment, a module that can suppress cracking during mounting and achieve more reliable connection can be obtained.

Figure 17:
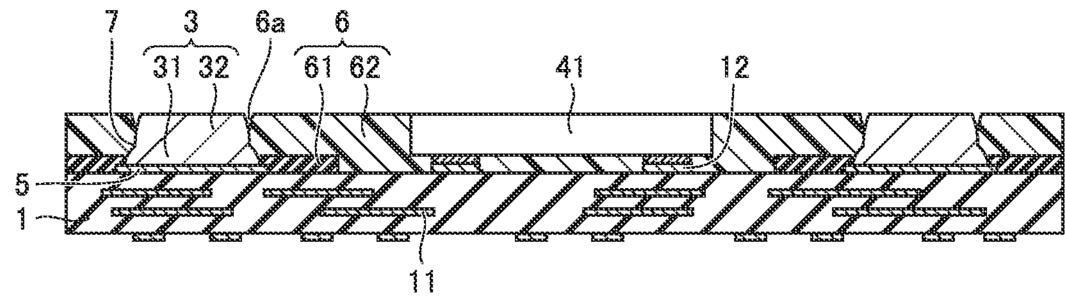
FIG. 17 illustrates a seventh step of the method for manufacturing the module according to the fifth embodiment of the present disclosure.

A further process may be continued without completing the module in the state shown in FIG. 16. That is, the method for manufacturing the module may further comprise, for example, a step of grinding an upper surface of protective member 6, first component 41, and second portion 32 together, as shown in FIG. 17, to obtain a structure in which the upper surface of protective member 6, an upper surface of first component 41, and an upper surface of the second portion are flush. By including this step, the module can be reduced in height.

Figure 18:
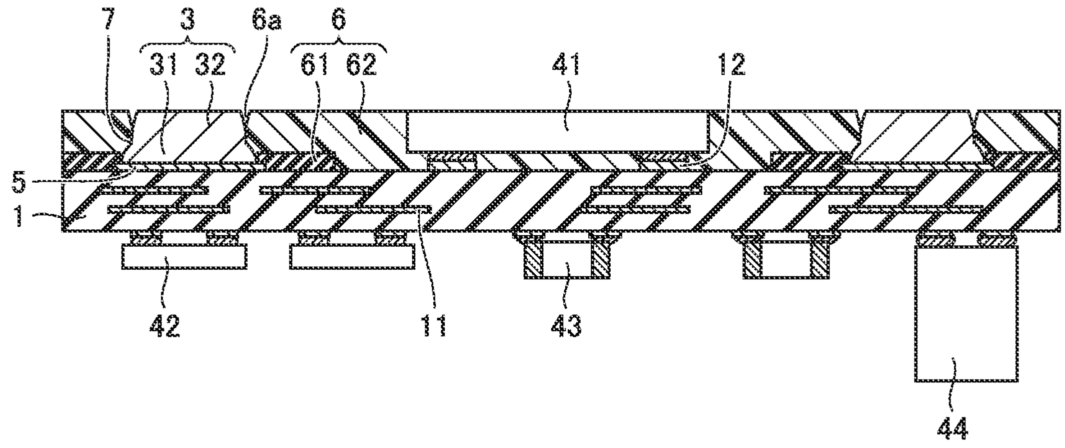
FIG. 18 illustrates a seventh step of the method for manufacturing the module according to the fifth embodiment of the present disclosure.

While the module may be completed by the above steps, it is further processed herein. As shown in FIG. 18, components 42, 43 and 44 are mounted on second surface 1*b* of substrate 1.

Figure 19:
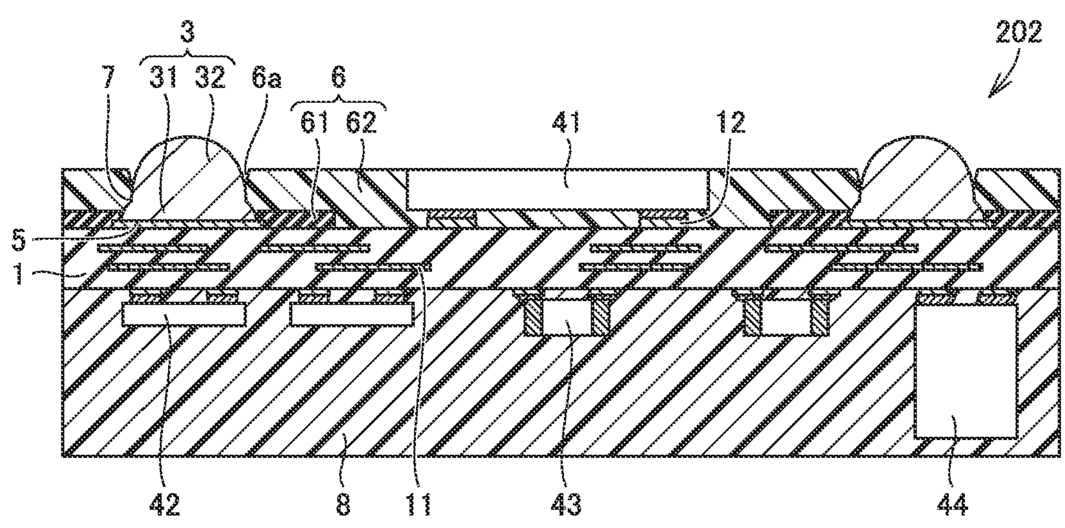
FIG. 19 illustrates an eighth step of the method for manufacturing the module according to the fifth embodiment of the present disclosure.

As shown in FIG. 19, resin seal 8 is disposed so as to cover second surface 1*b* of substrate 1 and components 42, 43, 44. Resin seal 8 may be formed by molding. Note, however, that FIG. 19 shows an example in which bump 3 protrudes from protective member 6. By completing the steps so far, module 202 is obtained. While bump 3 protrudes from protective member 6 in FIG. 19, a case in which bump 3 does not protrude from protective member 6 may similarly proceeds to a further process.

Figure 20:
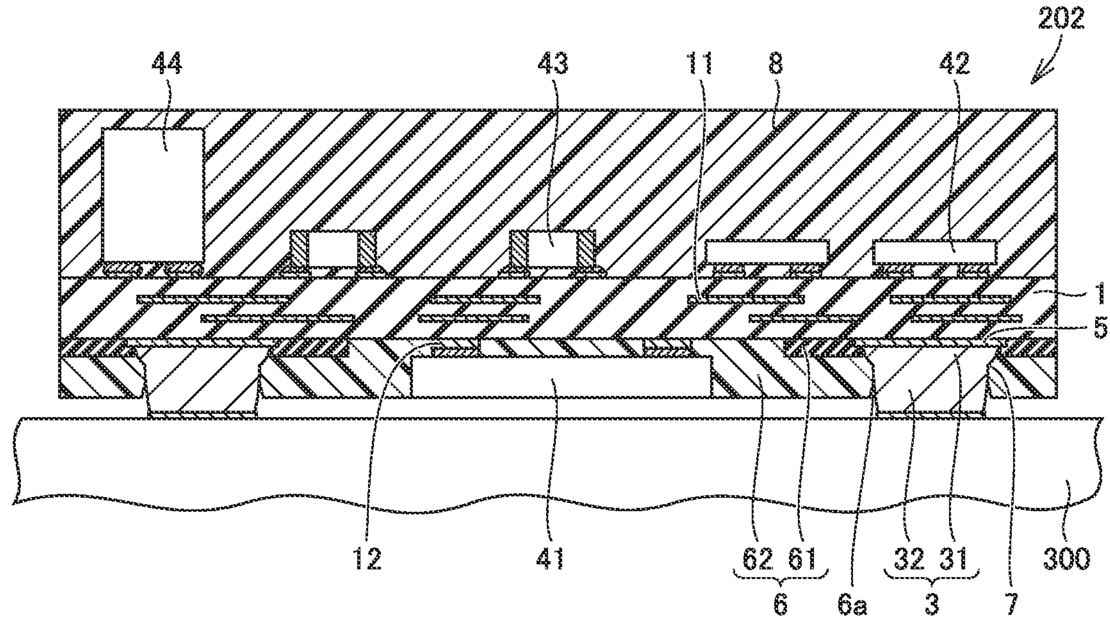
FIG. 20 is a cross section showing a state in which the module according to the fifth embodiment of the present disclosure is mounted on a mother substrate.

FIG. 20 shows module 202 mounted on a mother substrate 300. Bump 3 is connected to a pad electrode disposed in advance on a surface of mother substrate 300.

Preferred Configuration

Hereinafter, some preferred configurations will be described with reference to some embodiments described above.

Inner Surface of Opening

Figure 2:
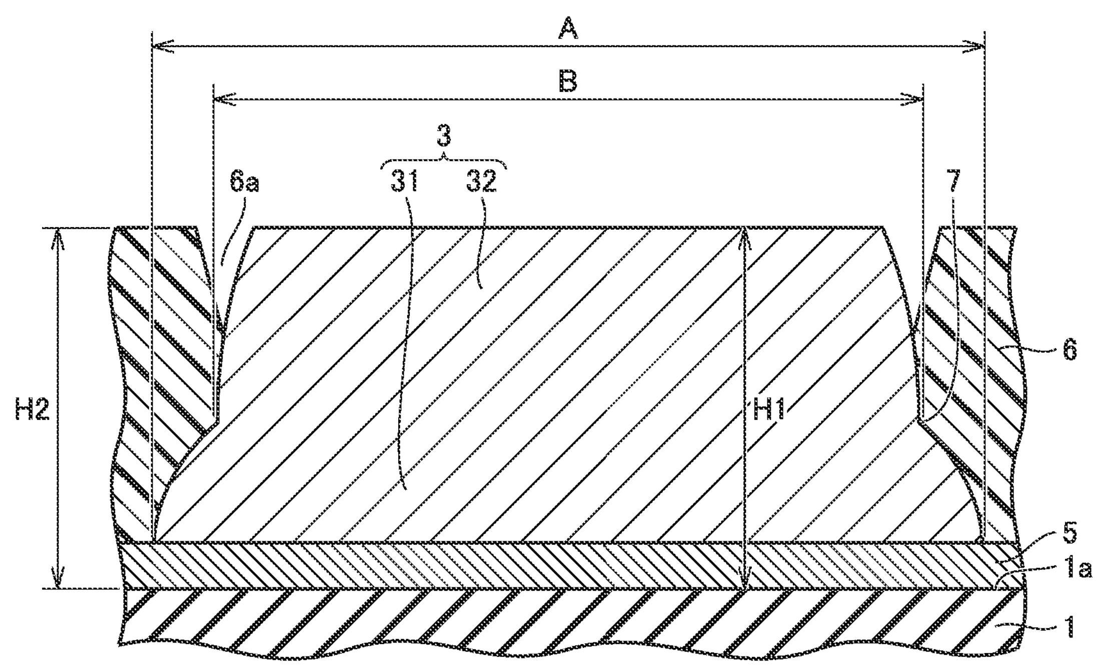
FIG. 2 is an enlarged view of a bump and a vicinity thereof shown in FIG. 1.
Figure 21:
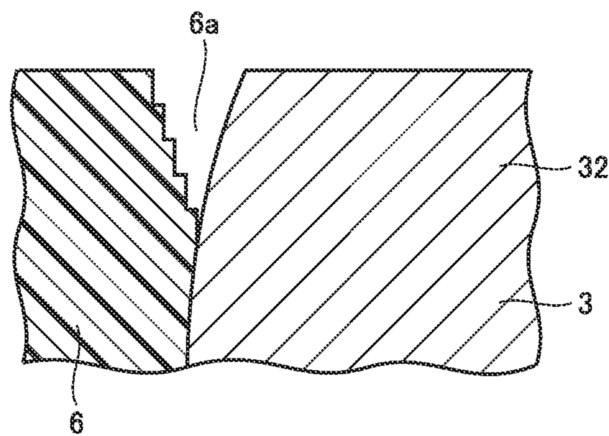
FIG. 21 is a partial cross section of a first example for illustrating a first matter as a preferred configuration.

First, it is preferable that, in substrate structure 101 shown in FIG. 2 in the first embodiment, when a portion of opening 6*a* having an internal surface exposed is enlarged, it have a configuration as shown in FIG. 21. That is, it is preferable that a plurality of steps are formed on the internal surface of opening 6*a*. Such steps can be formed by turning the laser processing for forming opening 6*a* in protective member 6. The turning in the laser processing means that a laser beam having a diameter smaller than that of opening 6*a* to be formed is used to repeat irradiation so as to trace an intended geometry of opening 6*a* and draw a circle inside the region of opening 6*a*. The laser beam may be emitted so as to draw a helix inside the region of opening 6*a*. Forming such a plurality of steps on the internal surface of opening 6*a* can increase a surface area of the internal surface of opening 6*a* to enhance the solder's adhesive force. This can stabilize a structure after mounting. This also applies to the substrate structure or module indicated in the second and third embodiments.

Figure 22:
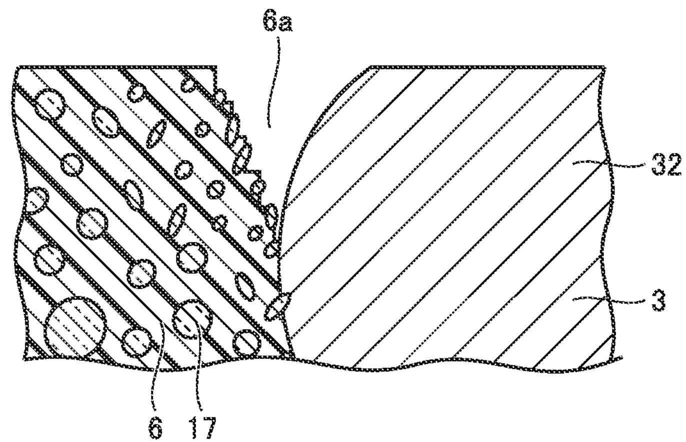
FIG. 22 is a partial cross section of a second example for illustrating the first matter as a preferred configuration.

Protective member 6 may contain a filler made of an inorganic oxide such as glass. FIG. 22 is an enlarged view of a portion similar to FIG. 21. In the example shown in FIG. 22, filler particles 17 of an inorganic oxide such as glass are distributed inside protective member 6. By appropriately adjusting in wavelength and intensity a laser beam used in the process for forming opening 6*a*, filler particles 17 can be exposed through the internal surface of opening 6*a*, as shown in FIG. 22. By employing this configuration, the solder's adhesive force can further be increased.

A product in which while filler particles 17 are exposed through the internal surface of opening 6*a*, as shown in FIG. 22, bump 3 partially protrudes above the upper surface of protective member 6, as shown in FIG. 10, may be a finished product.

Alloy Layer of Interface

Figure 23:
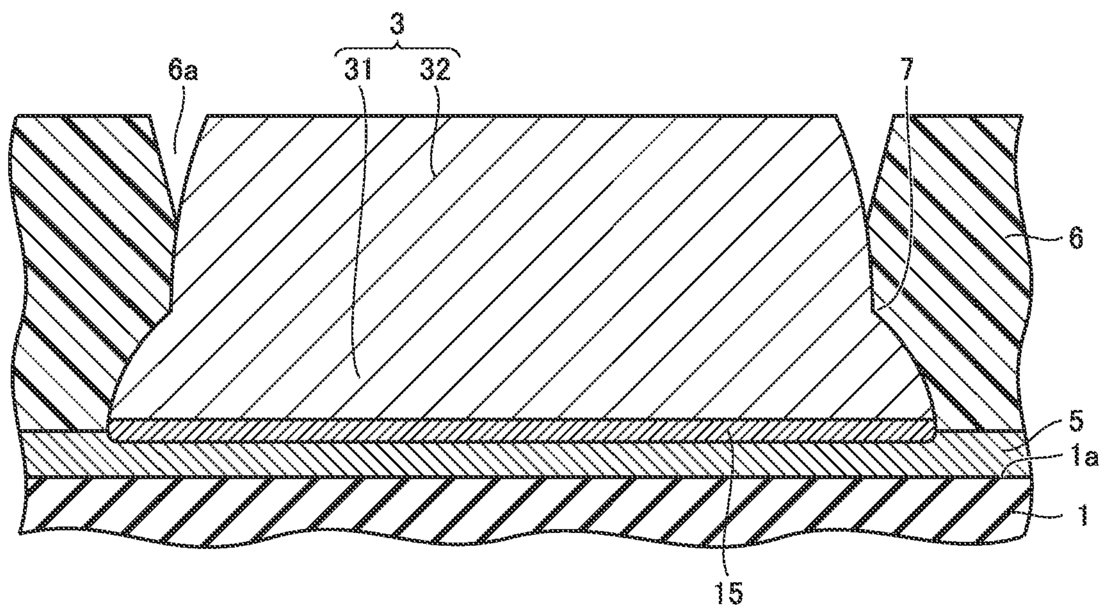
FIG. 23 is a partial cross section of a first example for illustrating a second matter as a preferred configuration.
Figure 24:
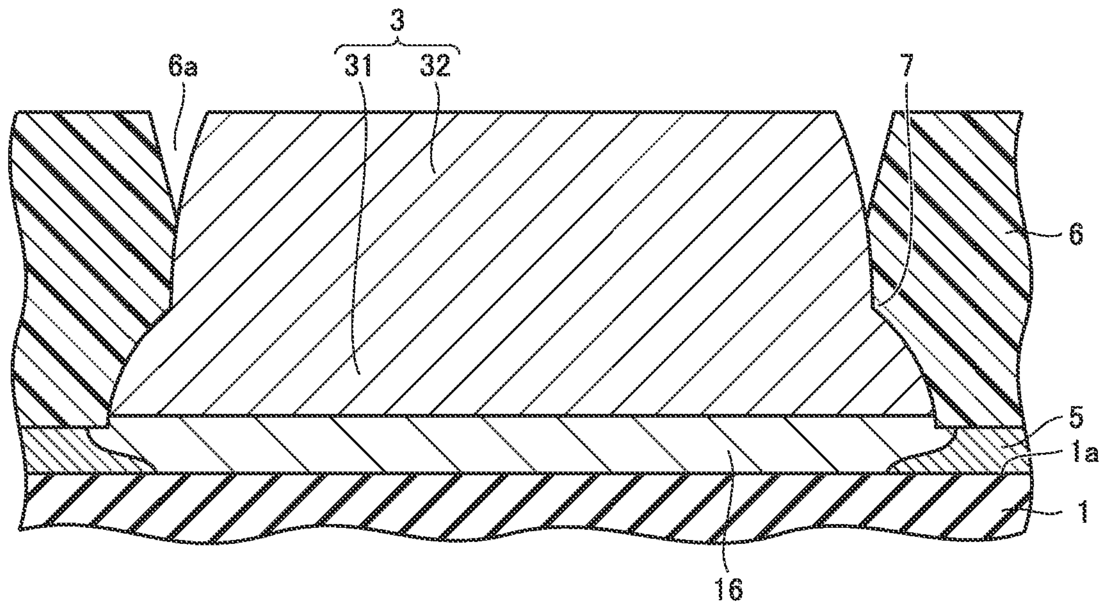
FIG. 24 is a partial cross section of a second example for illustrating the second matter as a preferred configuration.

Secondly, in substrate structure 101 shown in FIG. 2 in the first embodiment, a structure shown in FIG. 23 is preferable when a bonding portion between first electrode 5 and bump 3 is observed in an enlarged view. That is, it is preferable that a Cu—Sn alloy layer be interposed at an interface between first electrode 5 and bump 3 or that the first electrode include the Cu—Sn alloy layer. In the example shown in FIG. 23, a Cu—Sn alloy layer 15 is interposed at the interface between first electrode 5 and bump 3. Alternatively, a configuration shown in FIG. 24 may be used. In the example shown in FIG. 24, a Cu—Sn alloy layer 16 is formed as a portion of first electrode 5. First electrode 5 is originally an electrode containing Cu as a major material, and when it comes into contact with the solder, first electrode 5 and the solder have their metal materials diffused with each other. As a result of this diffusion, Cu—Sn alloy layer 15 or Cu—Sn alloy layer 16 is formed. By employing this configuration, mechanical strength can be increased. In order to thus form Cu—Sn alloy layer 15 or Cu—Sn alloy layer 16, first electrode 5 may be made of Cu and have a surface covered with an organic solderability preservative (OSP) film and solder may be bonded thereto. The solder's heat removes the OSP film, and the Cu component contained in first electrode 5 and the Sn component contained in the solder diffuse with each other to form Cu—Sn alloy layer 15 or Cu—Sn alloy layer 16.

Height of Bump

Figure 25:
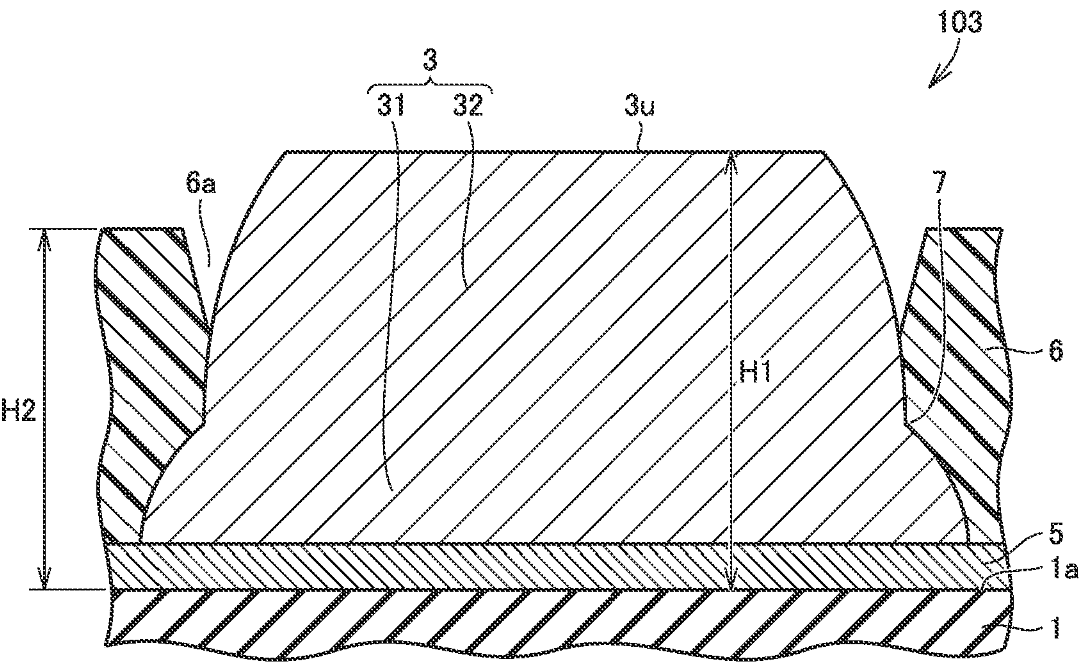
FIG. 25 is a partial cross section of a first example for illustrating a third matter as a preferred configuration.

Thirdly, as a variation of substrate structure 101 in the first embodiment, a substrate structure 103 shown in FIG. 25 may also be considered. In the example shown in FIG. 25, in the direction perpendicular to first surface 1*a*, height H1 of bump 3 with reference to first surface 1*a* is higher than height H2 of protective member 6 with reference to first surface 1*a*, and a surface 3*u* of bump 3 farthest from first surface 1*a* is flat. Such a configuration is obtained by grinding a tip of bump 3 to be flat without grinding protective member 6. Alternatively, it can be obtained by pressing a flat member against a tip of bump 3 to squash the tip of bump 3. Pressing a member having a common, single flat surface against a plurality of bumps 3, and squashing the tips of bumps 3 collectively, can provide the plurality of bumps 3 with a common, flat surface. By performing this process, bumps 3 can be leveled in height, and hence be increased in precision. This can improve the module in coplanarity. When bump 3 having a tip with flat surface 3*u* as shown in FIG. 25 is compared with bump 3 having a tip with a surface left curved as shown in FIG. 10, the former allows a larger contact area when mounting. This can increase bonding strength when soldering.

Figure 26:
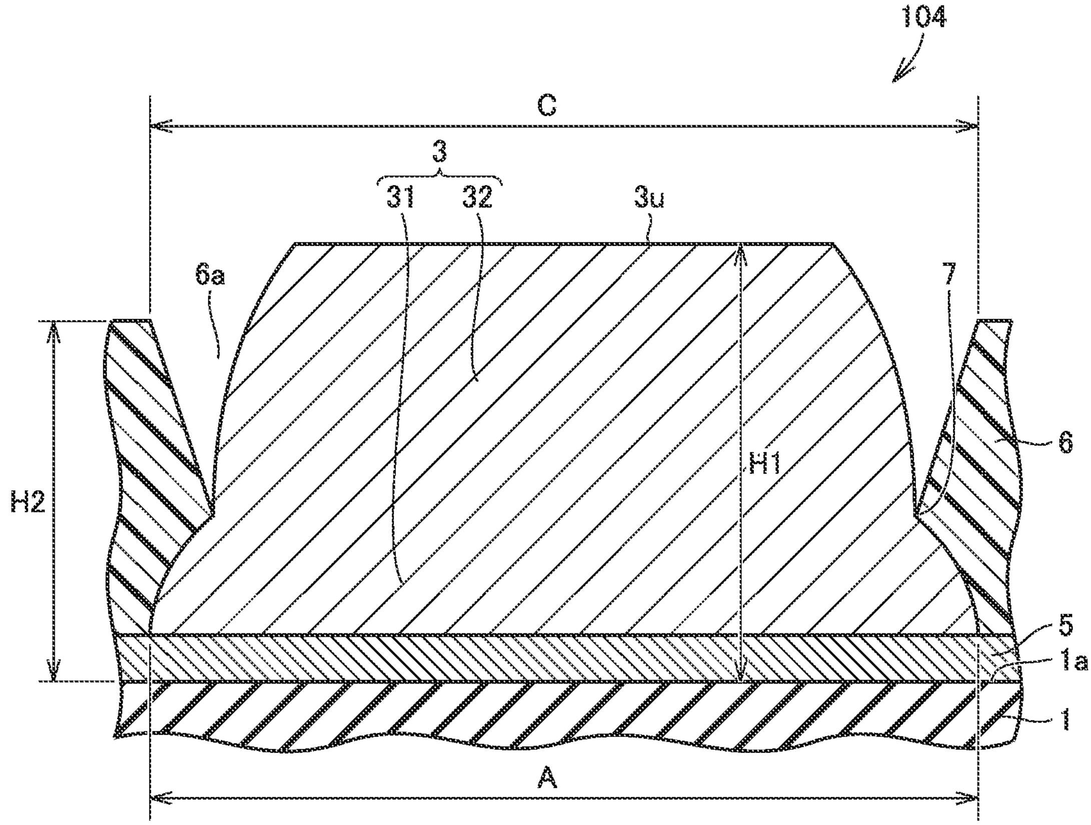
FIG. 26 is a partial cross section of a second example for illustrating the third matter as a preferred configuration.

Further, as a further variation, a substrate structure 104 shown in FIG. 26 may also be considered. In substrate structure 104, a diameter C of an upper end of opening 6*a* of protective member 6 is equal to or smaller than maximum diameter A of first portion 31 of bump 3. When the diameter of the upper end of opening 6*a* is increased, a gap between bump 3 and protective member 6 is increased, and a large amount of a bonding material can enter the gap, so that bonding using bump 3 can be firm. While FIG. 26 shows an example with C equal to A, C may be smaller than A.

In other words, substrate structure 104 includes substrate 1 having first surface 1*a*, first electrode 5 disposed on the first surface, bump 3 connected to first electrode 5, and protective member 6 that covers first surface 1*a* and covers a portion of bump 3, protective member 6 having opening 6*a*, bump 3 including a portion exposed through opening 6*a*, bump 3 including first portion 31 that is connected to first electrode 5 and second portion 32 that is located farther from first electrode 5 than first portion 31 and is connected to first portion 31, bump 3 having constriction 7 at a boundary between first portion 31 and second portion 32, opening 6*a* having an upper end with diameter C equal to or smaller than maximum diameter A of first portion 31.

Particulate Filler

Figure 27:
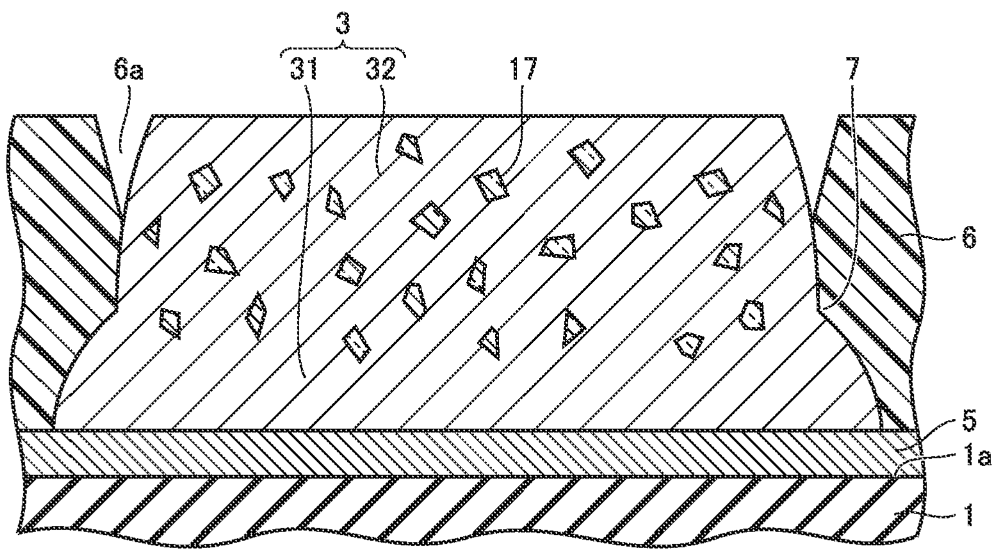
FIG. 27 is a partial cross section for illustrating a fourth matter as a preferred configuration.

Fourthly, although it is applicable to any of the first to third embodiments, it is preferable that a particulate filler is mixed in bump 3. This state is shown in FIG. 27. Filler particles 17 are mixed in bump 3. The filler is originally a component contained in protective member 6, and when opening 6*a* is formed in protective member 6 by laser processing, the filler seeps out on an exposed surface and becomes particulate. The particulate filler further scatters from the exposed surface and becomes filler particles 17, and filler particles 17 are mixed into bump 3. Thus, the configuration shown in FIG. 27 is obtained. By employing this configuration, when bump 3 is cracked, filler particles 17 can suppress further cracking.

Protective Member

Figure 28:
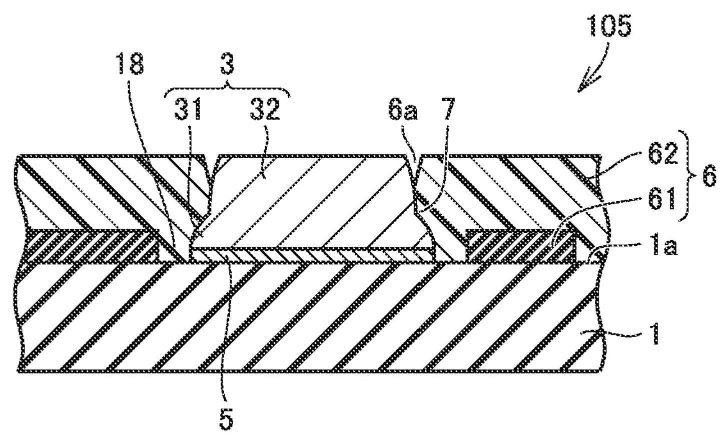
FIG. 28 is a partial cross section of a first example for illustrating a fifth matter as a preferred configuration.

Fifthly, as a variation of the second embodiment, a configuration shown in FIG. 28 may also be considered. While for substrate structure 102 of the second embodiment described with reference to FIG. 4, a so-called over-resist structure in which protective layer 61 covers a peripheral portion of first electrode 5 is adopted, for a substrate structure 105 shown in FIG. 28, a clearance resist structure is adopted. That is, in this example, protective member 6 includes protective layer 61 disposed on first surface 1*a* and spaced from both first electrode 5 and bump 3, and resin seal 62 that covers first portion 31 and protective layer 61 and is formed of a material having a composition different from that of protective layer 61. By employing this configuration, even if solder supplied to provide bump 3 overflows from first electrode 5, gap 18 present between first electrode 5 and protective layer 61, and gap 18 can receive the overflowing solder. This can prevent the overflowing solder from easily reaching another electrode and, as a result, a short circuit is less likely to occur.

Figure 29:
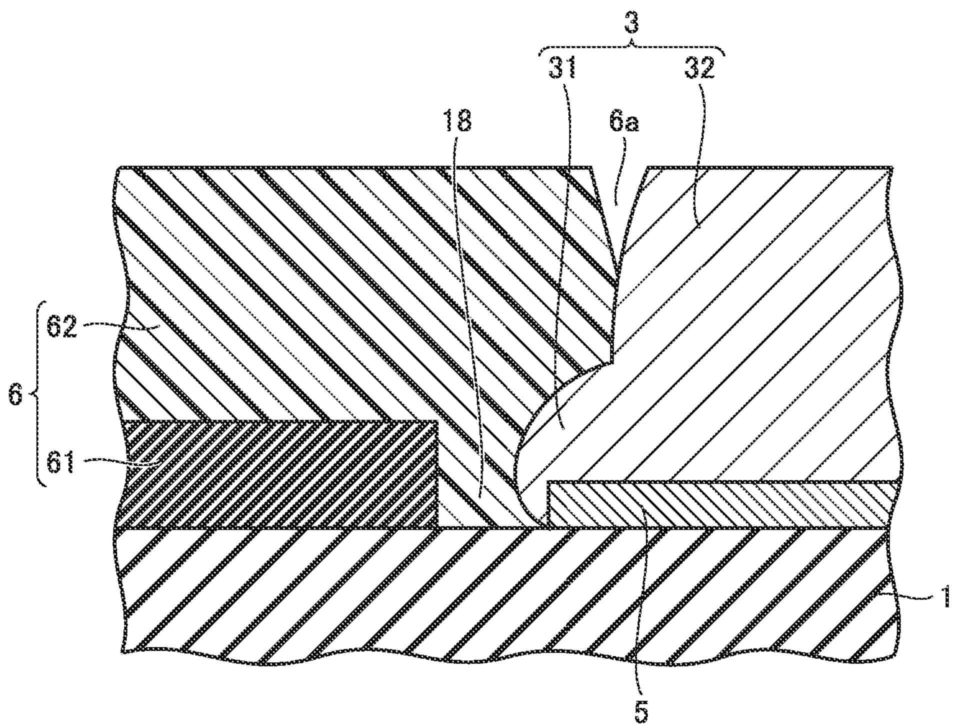
FIG. 29 is a partial cross section of a second example for illustrating the fifth matter as a preferred configuration.

Further, in the configuration shown in FIG. 28, it is preferable that bump 3 cover a side surface of first electrode 5. That is, a configuration shown in FIG. 29 is preferable. By employing this configuration, an interface between bump 3 and an upper surface of first electrode 5 is unexposed, and peeling between bump 3 and first electrode 5 can be prevented.

A plurality of the above embodiments may be combined as appropriate. It should be understood that the embodiments disclosed herein are illustrative and non-restrictive in any respect. The scope of the present disclosure is defined by the terms of the claims, and is intended to include any modifications within the meaning and scope equivalent to the terms of the claims.

1 substrate, 1*a* first surface, 1*b* second surface, 3 bump, 3*u* surface, 5 first electrode, 6 protective member, 6*a* opening, 7 constriction, 8 resin seal, 11 conductor pattern, 12 second electrode 15, 16 Cu—Sn alloy layer, 17 filler particle, 18 gap, 31 first portion, 32 second portion, 41 first component 42, 43, 44 component, 61 protective film, 62 resin seal, 101, 102, 103, 104, 105 substrate structure, 201, 202 module, 300 mother substrate.

The invention claimed is:

1. A substrate structure comprising:

a substrate having a first surface;

a first electrode disposed on the first surface;

a bump connected to the first electrode; and a protective member covering the first surface, covering a portion of the bump, and directly contacting the bump; wherein the protective member has an opening, and the bump includes a portion exposed through the opening, the bump includes a first portion connected to the first electrode, and a second portion being farther from the first electrode than the first portion and connected to the first portion, the bump has a constriction at a boundary between the first portion and the second portion, and diameter of the second portion is smaller than a maximum diameter of the first portion.

2. A substrate structure comprising:

a substrate having a first surface;

a first electrode disposed on the first surface;

a bump connected to the first electrode; and a protective member covering the first surface and covering a portion of the bump; wherein the protective member has an opening, and the bump includes a portion exposed through the opening, the bump includes a first portion covering connected to the first electrode, and a second portion being farther from the first electrode than the first portion and connected to the first portion, the bump has a constriction at a boundary between the first portion and the second portion, a diameter of an upper end of the opening is equal to or smaller than a maximum diameter of the first portion, and the protective member covers a portion of the second portion.

3. The substrate structure according to claim 1, wherein there is a gap between the second portion and an internal surface of the opening.

4. The substrate structure according to claim 1, wherein the protective member includes a protective layer covering a connection portion between the first electrode and the first portion, and a resin seal covering the first portion and the protective layer and being comprised of a material different in composition from the protective layer.

5. The substrate structure according to claim 1, wherein in the direction perpendicular to the first surface, a height of the bump with reference to the first surface is equal to a height of the protective member with reference to the first surface.

6. The substrate structure according to claim 1, wherein in the direction perpendicular to the first surface, a height of the second portion with reference to the constriction is lower than a height of the first portion with reference to a surface of the first electrode facing away from the substrate.

7. The substrate structure according to claim 1, wherein a plurality of steps are provided on an internal surface of the opening.

8. The substrate structure according to claim 1, wherein a Cu—Sn alloy layer is interposed at an interface between the first electrode and the bump or the first electrode includes a Cu—Sn alloy layer.

9. The substrate structure according to claim 1, wherein in the direction perpendicular to the first surface, a height of the bump with reference to the first surface is higher than a height of the protective member with reference to the first surface, and a surface of the bump farthest from the first surface is flat.

10. The substrate structure according to claim 1, wherein a particulate filler is mixed in the bump.

11. The substrate structure according to claim 1, wherein the protective member includes a protective layer disposed on the first surface and spaced from both the first electrode and the bump, and a resin seal covering the first portion and the protective layer and being comprised of a material different in composition from the protective layer.

12. The substrate structure according to claim 11, wherein the bump covers a side surface of the first electrode.

13. A module comprising:
a substrate structure according to claim 1; and
a first component mounted on the first surface,
the first component being at least partially covered with the protective member.

14. A module comprising:
a substrate structure comprising:
a first surface;
a first electrode disposed on the first surface;
a bump connected to the first electrode; and
a protective member covering the first surface and covering a portion of the bump; wherein
the protective member has an opening, and the bump includes a portion exposed through the opening,
the bump includes a first portion connected to the first electrode, and a second portion being farther from the first electrode than the first portion and connected to the first portion,
the bump has a constriction at a boundary between the first portion and the second portion, and
when viewed in a direction perpendicular to the first surface, a maximum diameter of the second portion is smaller than a maximum diameter of the first portion; and
a first component mounted on the first surface, the first component being at least partially covered with the protective member,
wherein in a direction perpendicular to the first surface, a height of the first component with reference to the first surface, a height of the bump with reference to the first surface, and a height of the protective member with reference to the first surface are equal.

15. The module according to claim 13, wherein the substrate has a second surface facing away from the first surface, a second component is mounted on the second surface, and the second surface and the second component are covered with a second resin seal.

16. A method for manufacturing a substrate structure for obtaining a substrate structure according to claim 1, the method comprising:
preparing a product, wherein in the product, the substrate and the first electrode are combined and the first portion is connected to the first electrode;
forming a protective member to cover the first portion;
grinding an upper surface of the protective member;
forming an opening in the protective member by laser processing to expose the first portion through the opening; and
connecting a second portion to the first portion.

17. The method for manufacturing a substrate structure according to claim 16, further comprising grinding an upper surface of the protective member and the second portion together to obtain a structure, wherein in the structure, the upper surface of the protective member and an upper surface of the second portion are flush.

18. A method for manufacturing a module for obtaining a module according to claim 13, comprising:
preparing a product, wherein in the product, the substrate and the first electrode are combined and the first portion is connected to the first electrode;
mounting the first component on the first surface;
forming a protective member to cover the first portion and the first component;
grinding an upper surface of the protective member to expose the first component;
forming an opening in the protective member by laser processing to expose the first portion through the opening; and
connecting a second portion to the first portion.

19. The method for manufacturing a module according to claim 18, further comprising grinding an upper surface of the protective member, the first component, and the second portion together to obtain a structure, wherein in the structure, the upper surface of the protective member, an upper surface of the first component, and an upper surface of the second portion are flush.

20. The substrate structure according to claim 3, wherein the first portion is entirely covered with the protective member.

* * * * *